(12) United States Patent
Lopez et al.

(10) Patent No.: US 12,490,570 B2
(45) Date of Patent: *Dec. 2, 2025

(54) THIN-FILM LED ARRAY WITH LOW REFRACTIVE INDEX PATTERNED STRUCTURES

(71) Applicant: Lumileds LLC, San Jose, CA (US)

(72) Inventors: Toni Lopez, Vaals (NL); Isaac Wildeson, Nashua, NH (US); Erik William Young, San Jose, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 378 days.

This patent is subject to a terminal disclaimer.

(21) Appl. No.: 17/981,889

(22) Filed: Nov. 7, 2022

(65) Prior Publication Data

US 2023/0154968 A1 May 18, 2023

Related U.S. Application Data

(60) Provisional application No. 63/278,670, filed on Nov. 12, 2021.

(51) Int. Cl.
*H10H 29/14* (2025.01)
(52) U.S. Cl.
CPC ................ *H10H 29/142* (2025.01)
(58) Field of Classification Search
None
See application file for complete search history.

(56) References Cited

U.S. PATENT DOCUMENTS

| | | |
|---|---|---|
| 6,410,942 B1 | 6/2002 | Thibeault et al. |
| 6,657,236 B1 | 12/2003 | Thibeault et al. |
| 6,821,804 B2 | 11/2004 | Thibeault et al. |
| 8,222,811 B2 | 7/2012 | Vaufrey et al. |
| 8,258,044 B2 | 9/2012 | Brun et al. |
| 8,487,340 B2 | 7/2013 | Gilet et al. |
| 8,613,860 B2 | 12/2013 | Chowdhury et al. |

(Continued)

FOREIGN PATENT DOCUMENTS

| | | |
|---|---|---|
| DE | 102010051286 A1 | 5/2012 |
| DE | 102012109460 A1 | 4/2014 |

(Continued)

OTHER PUBLICATIONS

PCT International Search Report and Written Opinion in PCT/US2022/049346 dated Mar. 20, 2023, 8 pages.

(Continued)

*Primary Examiner* — Daniel Whalen
(74) *Attorney, Agent, or Firm* — SERVILLA WHITNEY LLC

(57) ABSTRACT

Described are light emitting diode (LED) devices having a patterned dielectric layer on a substrate and methods for effectively growing epitaxial III-nitride layers on them. A nucleation layer, comprising a III-nitride material, is grown on a substrate before any patterning takes place. The patterned dielectric layer comprises a first plurality of features and a second plurality of features, where the second plurality of features has a height larger than the height of the first plurality of features. The second plurality of features aligns with the cathode layer of the trench.

20 Claims, 11 Drawing Sheets

(56) References Cited

U.S. PATENT DOCUMENTS

| | | |
|---|---|---|
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,890,111 B2 | 11/2014 | Templier et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,964,845 B2 | 3/2021 | Dimitropoulos et al. |
| 2001/0053618 A1 | 12/2001 | Kozaki et al. |
| 2006/0252236 A1 | 11/2006 | Chen et al. |
| 2010/0062554 A1* | 3/2010 | Kim .................. H10H 20/8312 |
| | | 257/E33.068 |
| 2011/0151607 A1 | 6/2011 | Landis et al. |
| 2011/0287606 A1 | 11/2011 | Brun et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2014/0077156 A1 | 3/2014 | Bavencove et al. |
| 2014/0094878 A1 | 4/2014 | Gossler et al. |
| 2014/0110663 A1 | 4/2014 | Choi et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0083163 A1* | 3/2018 | Saito .................. H10H 20/0137 |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2020/0194549 A1* | 6/2020 | Dasgupta ............. H10D 62/117 |
| 2021/0119075 A1 | 4/2021 | Charles |
| 2021/0193863 A1* | 6/2021 | Wildeson .......... H01L 21/02647 |
| 2021/0193869 A1* | 6/2021 | Wildeson ............. H10H 20/825 |
| 2022/0238774 A1 | 7/2022 | Chaji |
| 2023/0155070 A1* | 5/2023 | Lopez .................. H10H 20/018 |
| | | 257/98 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2002511659 A | 4/2002 |
| JP | 2007116097 A | 5/2007 |
| JP | 2016066765 A | 4/2016 |
| JP | 2017038006 A | 2/2017 |
| KR | 20080082326 A | 9/2008 |
| KR | 20110042563 A | 4/2011 |
| KR | 20120084119 A | 7/2012 |
| KR | 20130085582 A | 7/2013 |
| KR | 101296281 B1 | 8/2013 |
| KR | 20140118466 A | 10/2014 |
| KR | 20150049806 A | 5/2015 |
| KR | 20150056637 A | 5/2015 |
| KR | 20170018687 A | 2/2017 |
| KR | 20180010670 A | 1/2018 |
| KR | 20180114413 A | 10/2018 |
| KR | 20200121815 A | 10/2020 |
| TW | 201417339 A | 5/2014 |
| TW | 201620163 A | 6/2016 |
| WO | 2006138465 A2 | 12/2006 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2015194244 A1 | 12/2015 |
| WO | 2016079505 A1 | 5/2016 |
| WO | 2017068029 A1 | 4/2017 |

(56) References Cited

FOREIGN PATENT DOCUMENTS

| WO | 2017102708 A1 | 6/2017 |
| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A1 | 6/2019 |

OTHER PUBLICATIONS

PCT International Search Report and Written Opinion in PCT/US2022/049349 dated Mar. 23, 2023, 8 pages.
Non-Final Office Action in U.S. Appl. No. 17/981,926 dated Mar. 7, 2025, 22 pages.

* cited by examiner

THIN-FILM LED ARRAY WITH LOW REFRACTIVE INDEX PATTERNED STRUCTURES

CROSS-REFERENCE TO RELATED APPLICATIONS

This application claims priority to U.S. Provisional Application No. 63/278,670, filed Nov. 12, 2021, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to light emitting diode devices that include a patterned low refractive index structure on a planar sapphire substrate.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Inorganic light emitting diodes (i-LEDs) have been widely used to create different types of displays, LED matrices, and light engines, including automotive adaptive headlights, augmented-, virtual-, mix-reality (AR/VR/MR) headsets, smart glasses, and displays for mobile phones, smart watches, monitors, and televisions. The individual LED pixels in these architectures may have an area of a few square millimeters down to a few square micrometers, depending upon the matrix or display size and its pixel per inch requirements. One common approach is to create a monolithic array of LED pixels on an EPI wafer and later transfer and hybridize these LED arrays to a backplane to control individual pixels.

Monolithic arrays may require metal (e.g., Al-based) side-contacts, which serve as the electrical cathode for each pixel and also provide reflective sidewalls in between the pixels to reduce light scattering and propagation in lateral directions. With this geometry, a metal grid is created between pixels of an LED display or matrix. Such contacts are typically extended deep into the bottom of the trench and reach the substrate's surface. Deep side contacts are required to ensure low sheet and contact resistance for cathode contacts, and to optically separate each LED pixel so that there is not optical crosstalk, thereby maximizing optical contrast.

In these architectures, the substrate (e.g., sapphire, silicon) should be removed after the LED array is integrated with the backplane controller to enhance light extraction and beam profiling. The standard approach to remove a sapphire substrate is by a laser lift-off process where a laser beam is used to detach the substrate from the epitaxial layers. Since Al-based cathodes are entrenched down to the substrate's surface, they will interact with the laser beam from the laser lift-off process and create Al-rich droplets or other Al-containing by-products, which are generally absorptive and, thus, decrease light output. Impaired sidewall contacts may also affect the electrical performance of pixels and could result in unstable $V_f$ or electrical leakage development. Such effects could also pose long-term reliability concerns.

Therefore, there is a need for light emitting diode (LED) devices with high luminance levels and high light extraction efficiency.

SUMMARY

Embodiments of the disclosure are directed to light emitting diode (LED) devices. In an embodiment, a light emitting diode (LED) device comprises: a nucleation layer on a substrate, the nucleation layer comprising a first III-nitride material; a patterned dielectric layer on a top surface of the nucleation layer, the patterned dielectric layer comprising a first plurality of features, a second plurality of features adjacent the first plurality of features, and a plurality of spaces between the first plurality of features and the second plurality of features, the first plurality of features and the second plurality of features protruding from a top surface of the nucleation layer, the second plurality of features having a second height greater than a first height of the first plurality of features, and the plurality of spaces exposing a top surface of the nucleation layer; a III-nitride layer on the first plurality of features and on the plurality of spaces, the III-nitride layer comprising a second III-nitride material; and a metal contact aligned with and directly contacting the second plurality of features.

Embodiments of the disclosure are directed to methods of manufacturing light emitting diode (LED) devices. In one or more embodiments, a method of manufacturing a light emitting diode (LED) device comprises: depositing a nucleation layer on a substrate, the nucleation layer comprising a first III-nitride material; depositing a dielectric layer on a top surface of the nucleation layer, the dielectric layer comprising a low refractive index dielectric material; patterning the dielectric layer to form a patterned surface having a first plurality of features, a second plurality of features adjacent the first plurality of features, and having a plurality of spaces between the first plurality of features and the second plurality of features, the first plurality of features and the second plurality of features protruding from a top surface of the nucleation layer, the second plurality of features having a second height and a second width greater than a first height and a first width of the first plurality of features, and the plurality of spaces exposing a top surface of the nucleation layer; epitaxially growing a III-nitride layer on the patterned surface, the III-nitride layer comprising a second III-nitride material; and forming a metal contact aligned with and directly contacting the second plurality of features.

One or more embodiments of the disclosure are directed to light emitting diode (LED) devices. In an embodiment, a light emitting diode (LED) device comprises: a nucleation layer on a substrate, the nucleation layer comprising a first III-nitride material; a patterned dielectric layer on a top surface of the nucleation layer, the patterned dielectric layer comprising a first plurality of features, a second plurality of features adjacent the first plurality of features, and a plurality of spaces between the first plurality of features and the second plurality of features, the first plurality of features and the second plurality of features protruding from a top surface of the nucleation layer, the second plurality of features having a second height greater than a first height of the first plurality of features, and the plurality of spaces exposing a top surface of the nucleation layer; a reflector layer on a surface of the second plurality of features distal from the nucleation layer; a III-nitride layer on the first plurality of features and on the plurality of spaces, the III-nitride layer comprising a second III-nitride material; and a metal contact aligned with and directly contacting the second plurality of features.

Embodiments of the disclosure are directed to methods of manufacturing light emitting diode (LED) devices. In one or more embodiments, a method of manufacturing a light emitting diode (LED) device comprises: depositing a nucleation layer on a substrate, the nucleation layer comprising a first III-nitride material; depositing a dielectric layer on a top surface of the nucleation layer, the dielectric layer comprising a low refractive index dielectric material; patterning the dielectric layer to form a patterned surface having a first plurality of features, a second plurality of features adjacent the first plurality of features, and having a plurality of spaces between the first plurality of features and the second plurality of features, the first plurality of features and the second plurality of features protruding from a top surface of the nucleation layer, the second plurality of features having a second height and a second width greater than a first height and a first width of the first plurality of features, and the plurality of spaces exposing a top surface of the nucleation layer; depositing a reflector layer on a surface of the second plurality of features distal from the nucleation layer; epitaxially growing a III-nitride layer on the patterned surface, the III-nitride layer comprising a second III-nitride material; and forming a metal contact aligned with and directly contacting the second plurality of features.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limited in the figures of the accompanying drawings in which like references indicate similar elements.

DETAILED DESCRIPTION

Figure 1:
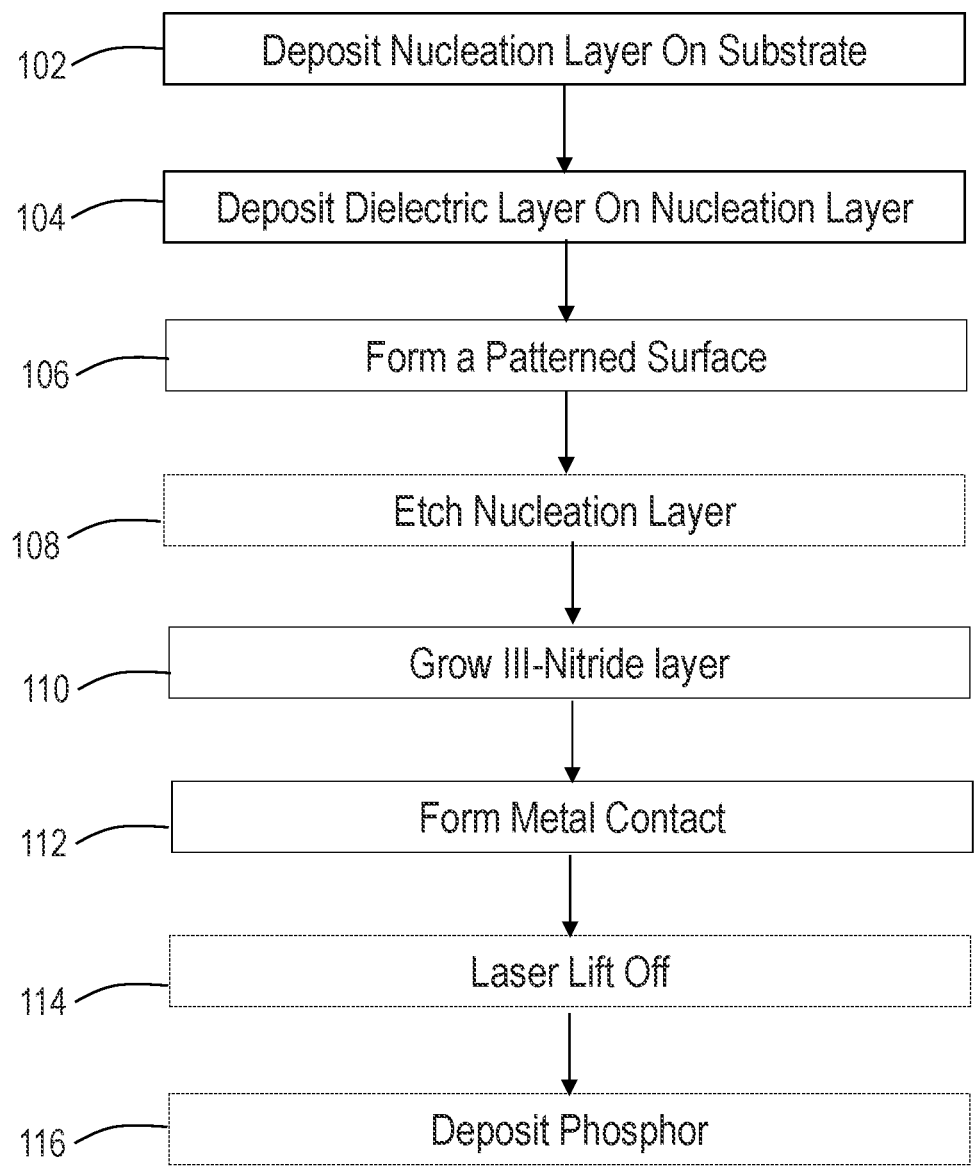
FIG. 1 illustrates a process flow diagram for a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN, and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe different kinds of patterned substrates and methods for effectively growing epitaxial III-nitride layers on them. In one or more embodiments, a nucleation layer is advantageously grown on a substrate before any patterning takes place. Without intending to be bound by theory, it is thought that this nucleation layer is able to interface with the sapphire substrate it is deposited on, and the dielectric layer deposited on the nucleation layer. In one or more embodiments, a thin nucleation layer, is deposited on a substrate prior to forming a dielectric layer and forming the dielectric pattern features. The dielectric layer may advantageously comprise a low refractive index material. The dielectric layer is patterned to form two types of structures: a periodic structure forming a particular lattice suitable to maximize scattering and a periodic structure of period equal to that of the LED pixel array with geometry optimized to refract light within in each pixel.

FIG. 1 depicts a flow diagram of a method 100 of manufacturing a light emitting diode (LED) device in accordance with one or more embodiments of the present disclosure. With reference to FIG. 1, in one or more embodiments, the method begins at operation 102 by depositing a nucleation layer on a substrate. At operation 104 a dielectric layer is deposited on the nucleation layer. At operation 106, a patterned surface is formed. At operation 110, a III-nitride layer is grown, e.g., epitaxially, on the areas of the nucleation layer which are not covered by dielectric material. At operation 112, a metal contact is formed. At operation 114, the substrate (e.g., sapphire) is removed by laser lift-off. At operation 116, a phosphor layer may be deposited.

Figure 2A:
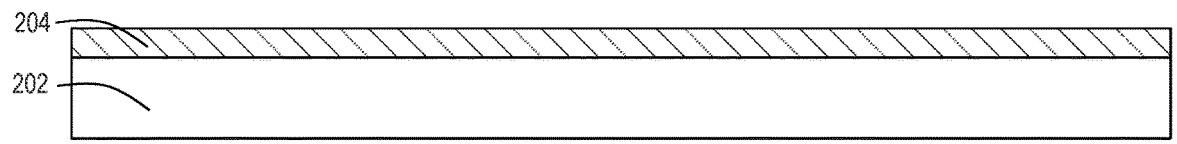
FIG. 2A illustrates a cross-sectional view of a light emitting diode (LED) device according to one or more embodiments.

FIG. 2A is cross-section view of a LED device according to one or more embodiments. With reference to FIG. 2A, a nucleation layer 204 is deposited on a substrate 202.

The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to deposition of the nucleation layer. Thus, in some embodiments, the substrate is not patterned and can be considered to be flat or substantially flat or planar. Accordingly, in one or more embodiments, the method of the disclosure differs significantly from the conventional patterned substrate, e.g., patterned sapphire substrate (PSS), fabrication approach in which pattern features are etched directly into the substrate before deposition of a nucleation layer.

Without intending to be bound by theory, it is thought that the deposition of a nucleation layer 204 on the substrate 202 prior to patterning provides critical advantages. In one or more embodiments, it was found that the deposition of a nucleation layer 204 on the substrate 202 prior to patterning provided performance improvements for directional emitters with the growth substrate remaining attached in the finished device. In one or more embodiments, the performance improvements include increased light extraction efficiency (ExE) in emitters without a lens (dome), increased brightness, and increased angular directionality (forward gain, effective increased lumen output within a narrow angular emission cone (e.g., 45 degrees).

In one or more embodiments, the nucleation layer 204 comprises a III-nitride material. In some embodiments, the III-nitride material comprises one or more of gallium (Ga), aluminum (Al), and indium (In). Thus, in some embodiments, the nucleation layer 204 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the nucleation layer 204 comprises aluminum nitride (AlN).

In one or more embodiments, the nucleation layer 204 has a thickness in a range of from about 5 nm to about 100 nm, including a range of from about 10 nm to 75 nm, a range of from about 5 nm to about 90 nm, a range of from about 10 nm to about 60 nm, a range of from about 5 nm to about 50 nm, a range of from about 10 nm to about 50 nm, and a range of from about 10 nm to about 90 nm.

In one or more embodiments, the nucleation layer 204 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g., a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e., two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g., a thin film on a substrate. Similarly, to a thermal ALD process, a purge step maybe conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

Figure 2B:
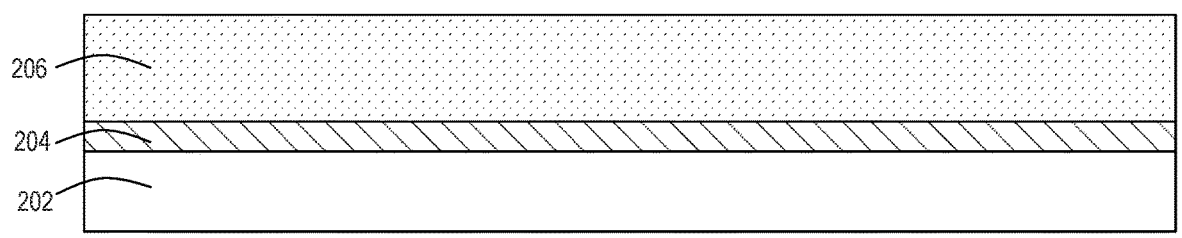
FIG. 2B illustrates a cross-sectional view of a light emitting diode (LED) device according to one or more embodiments.

FIG. 2B is cross-section view of a LED device according to one or more embodiments. With reference to FIG. 2B, a dielectric layer 206 is deposited on the nucleation layer 204.

As used herein, the term "dielectric" refers to an electrical insulator material that can be polarized by an applied electric field. The dielectric material may comprise any suitable material known to the skilled artisan. In one or more embodiments, the dielectric material comprises a low refractive index material. In some embodiments, the dielectric material comprises a material have a refractive index in a range of from about 1.2 to about 1. In one or more embodiments, the dielectric layer includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer comprises silicon nitride ($Si_3N_4$). In one or more embodiments, the dielectric layer comprises silicon oxide ($SiO_2$). In some embodiments, the dielectric layer composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g., silicon oxycarbide (SiOC)), and oxynitrocarbides (e.g., silicon oxycarbonitride (SiNCO)).

In one or more embodiments, the dielectric layer 206 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the dielectric layer 206 has a thickness in a range of from about 10 nm to about 5 μm, including from about 100 nm to about 4 μm, from about 50 nm to about 4 μm, from about 200 nm to about 3 μm.

Figure 2C:
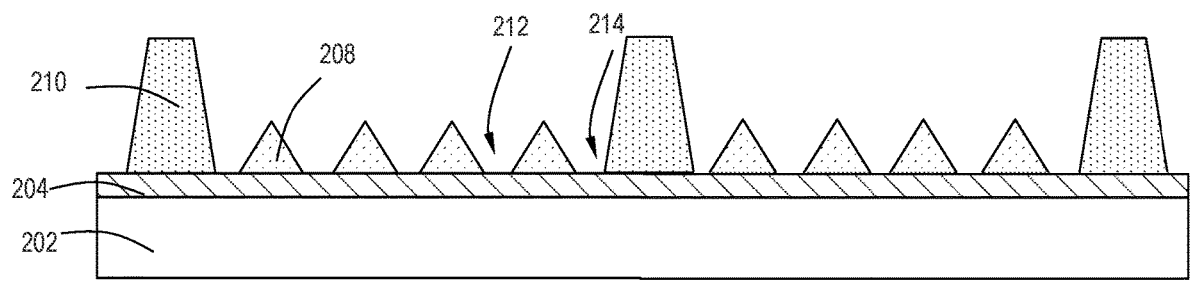
FIG. 2C illustrates a cross-sectional view of a light emitting diode (LED) device according to one or more embodiments.
Figure 2D:
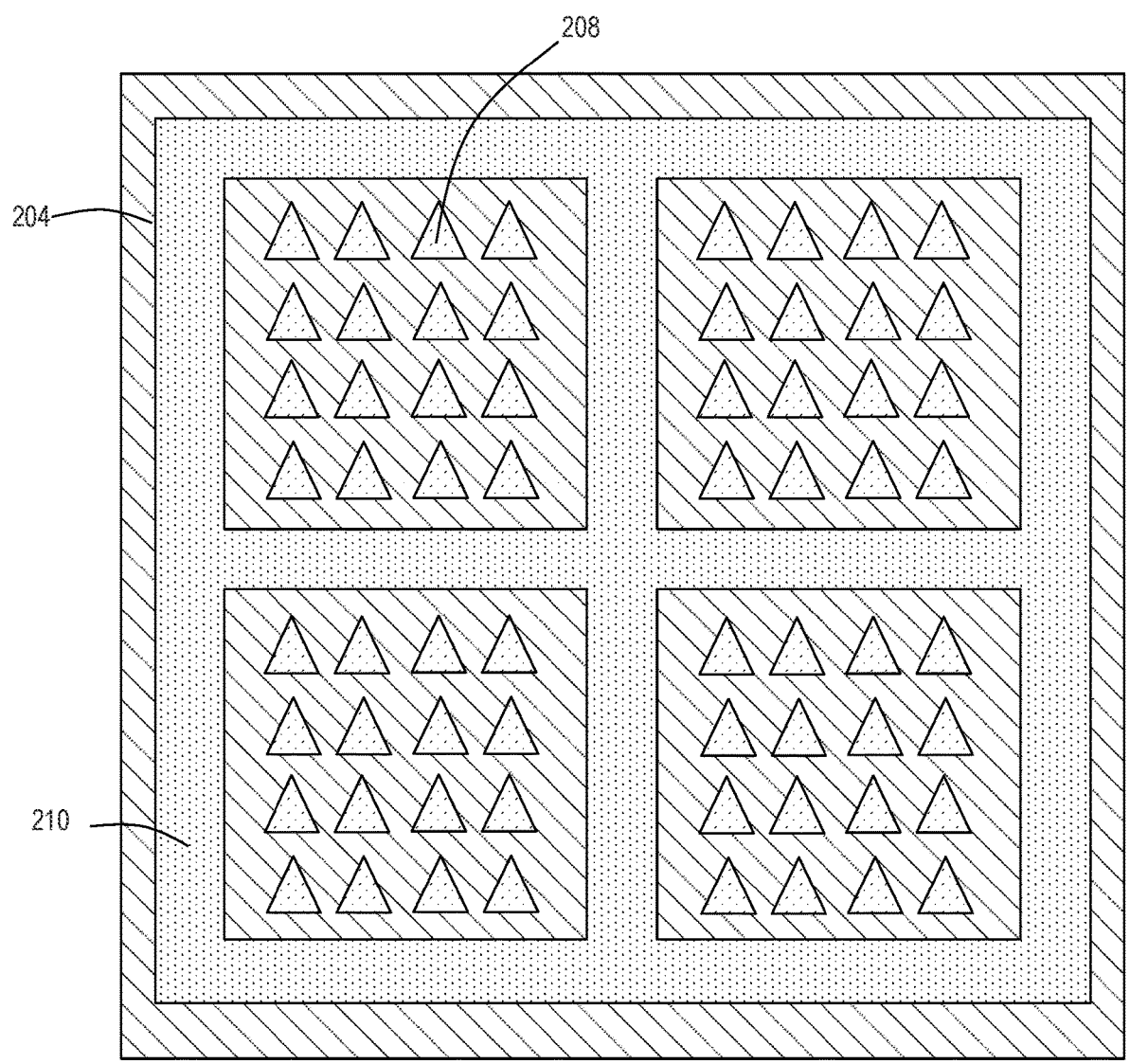
FIG. 2D illustrates a plan view of a light emitting diode (LED) device of FIG. 2C.

FIG. 2C is a cross-section view of a LED device according to one or more embodiments. FIG. 2D is a plan view of the LED device of FIG. 2C. With reference to FIGS. 2C-2D, a patterned surface is formed. Thus, in one or more embodiments, a patterned dielectric layer is formed. In one or more embodiments, the dielectric layer 206 is patterned according to any appropriate patterning technique known to one of skill in the art. In some embodiments, the patterned dielectric layer comprises a first plurality of features 208 and a second plurality of features 210 adjacent to the first plurality of features 208. In one or more embodiments, the first plurality of features 208 and the second plurality of features 210 protrude from the top surface of the nucleation layer 204 and have a plurality of spaces 212, 214 between the first plurality of features 208 and the second plurality of features 210.

In one or more embodiments, a first plurality of spaces 212 is between the first plurality of features 208 and an adjacent feature 208. In one or more embodiments, a second plurality of spaces 214 is between the first plurality of features 208 and the adjacent second plurality of features 210. In one or more embodiments, the plurality of spaces 212, 214 expose a top surface of the nucleation layer 204.

In one or more embodiments, the second plurality of features 210 have a height greater than the height of the first plurality of features 208.

In one or more embodiments, the first plurality of features 208 protruding from the surface of the nucleation layer 204 can have any shape known to one of skill in the art. In one or more embodiments, the second plurality of features 210 protruding from the surface of the nucleation layer 204 can have any shape known to one of skill in the art.

In one or more embodiments, the shape of the plurality of protruding features 208 and features 210 includes, but is not limited to, a hemispherical shape, a triangular pyramidal shape, a quadrangular pyramidal shape, a hexagonal pyramidal shape, a conical shape, a semi-spherical shape, or a cut-spherical shape. In one or more embodiments, the shape of the plurality of protruding features 208 and the plurality of protruding features 210 is the same. In other embodiments, the shape of the plurality of protruding features 208 and the plurality of protruding features 210 is different.

In one or more embodiments, the first plurality of features 208 protruding from the surface of the nucleation layer 204 has a height in a range of from about 10 nm to about 3 μm, including a range of from about 500 nm to about 2 μm, a range of from about 100 nm to about 1 μm, a range of from about 250 nm to about 2.5 μm, and a range of from about 100 nm to about 2 μm.

In one or more embodiments, the second plurality of features 210 have a width that is greater than the width of the first plurality of features 208. In other embodiments, the first plurality of features 208 have a width that is greater than the width of the second plurality of features 210.

In one or more embodiments, the first plurality of features 208 protruding from the surface of the nucleation layer 204 has a width in a range of from about 5 nm to about 3 μm, including a range from about 10 nm to about 2 μm, and a range of from about 100 nm to about 1 μm.

In one of more embodiments, the first plurality of features 208 protruding from the surface of the nucleation layer 204 has a pitch in a range of from about 50 nm to about 5000 nm, including a range from about 500 nm to about 2000 nm, and a range of from about 500 nm to about 1000 nm.

In one or more embodiments, the second plurality of features 210 protruding from the surface of the nucleation layer 204 has a height in a range of from about 10 nm to about 5 μm, including a range of from about 500 nm to about 4 μm, a range of from about 100 nm to about 5 μm, a range of from about 250 nm to about 4 μm, and a range of from about 100 nm to about 5 μm.

In other embodiments, the second plurality of features 210 has a height that is 10% to 90% of the height of the III-nitride layer 216.

In one or more embodiments, the second plurality of features 210 protruding from the surface of the nucleation layer 204 has a width in a range of from about 100 nm to about 10 μm, including a range from about 100 nm to about 5 μm, and a range of from about 500 nm to about 10 μm.

In one of more embodiments, the second plurality of features 210 protruding from the surface of the nucleation layer 204 has a pitch in a range of from about 5 μm to about 80 μm, including a range from about 5 μm to about 50 μm, and a range of from about 5 μm to about 25 μm.

In one or more specific embodiments, a hexagonal pattern of a first plurality of features 208 and a second plurality of features 210 protruding from the surface of the nucleation layer 204 is transferred to a photoresist coating (not illustrated) on the dielectric layer 206 using nanoimprint lithography. In one or more embodiments, the substrate 202 is etched in a reactive ion etching (RIE) tool using conditions that etch the dielectric layer 206 efficiently but etch the nucleation layer 204 very slowly or not at all. In other words, the etching is selective to the dielectric layer 206 over the nucleation layer 204. In one or more embodiments, the photoresist is removed, and the wafer is cleaned, resulting in a hexagonal array of cones of the dielectric layer 204. In one or more embodiments, the half-angle of the plurality of features 208 is controlled by adjusting parameters such as the thickness of the starting dielectric layer 206, thickness of photoresist layer (not illustrated), and differences in RIE etch rates that depend on surface angles and/or materials.

Figure 2E:
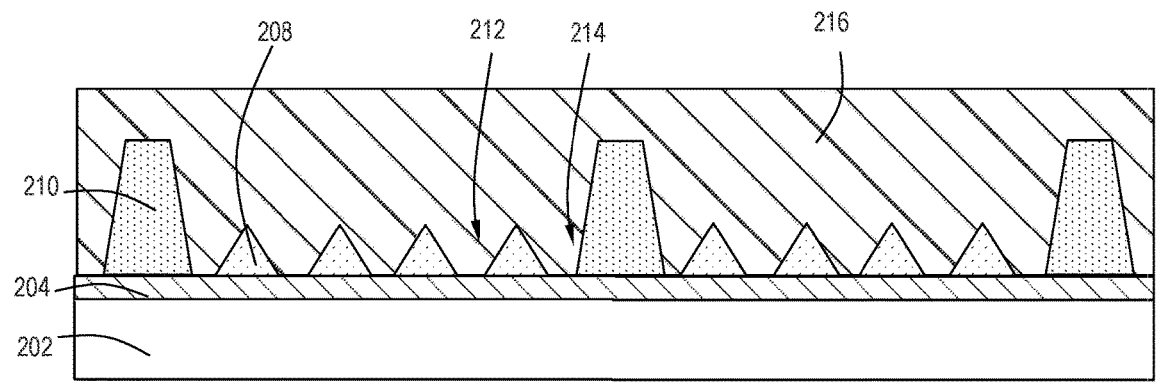
FIG. 2E illustrates a cross-sectional view of a light emitting diode (LED) device according to one or more embodiments.

FIG. 2E is a cross-section view of a LED device according to one or more embodiments. With reference to FIG. 2E, a III-nitride layer 216 is grown, e.g., epitaxially, on the patterned dielectric layer on the first plurality of features 208 and on the second plurality of features 210. In one or more embodiments, a III-nitride layer 216 is grown on the nucleation layer 204 and in or on the plurality of spaces 212, 214 between the first plurality of features 208 and the second plurality of features 210. In one or more embodiments, the first plurality of features 208 and the second plurality of features 210 have at least one sidewall (not illustrated), and the III-nitride layer grows on the at least one sidewall of the first plurality of features 208 and on the at least one sidewall of the second plurality of features 210.

In one or more embodiments, the III-nitride layer 216 comprises a III-nitride material. In some embodiments, the III-nitride material comprises one or more of gallium (Ga), aluminum (Al), and indium (In). Thus, in some embodiments, the III-nitride layer 216 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 216 comprises gallium nitride. In some embodiments, the III-nitride layer 216 and the nucleation layer 204 comprise the same III-nitride material. In other embodiments, the III-nitride layer 216 and the nucleation layer 204 comprise different III-nitride materials. In a specific embodiment, the nucleation layer 204 comprises aluminum nitride (AlN) and the III-nitride layer 216 comprises gallium nitride (GaN).

In one or more embodiments, the III-nitride layer 216 is placed in a metalorganic vapor-phase epitaxy (MOVPE) reactor for epitaxy of LED device layers. Unlike during a typical MOVPE growth run, which starts with a low temperature nucleation layer, in one or more embodiments the MOVPE process starts with high temperature III-nitride growth taking advantage of the large difference in III-nitride nucleation rates on the pre-deposited nucleation layer 204 versus the surfaces of patterned dielectric layer with the first plurality of features 208 and the second plurality of features 210. In one or more embodiments, after the epitaxy, e.g., MOVPE, growth run, the device 200 is processed as is typical for a conventional PSS based LED.

Figure 2F:
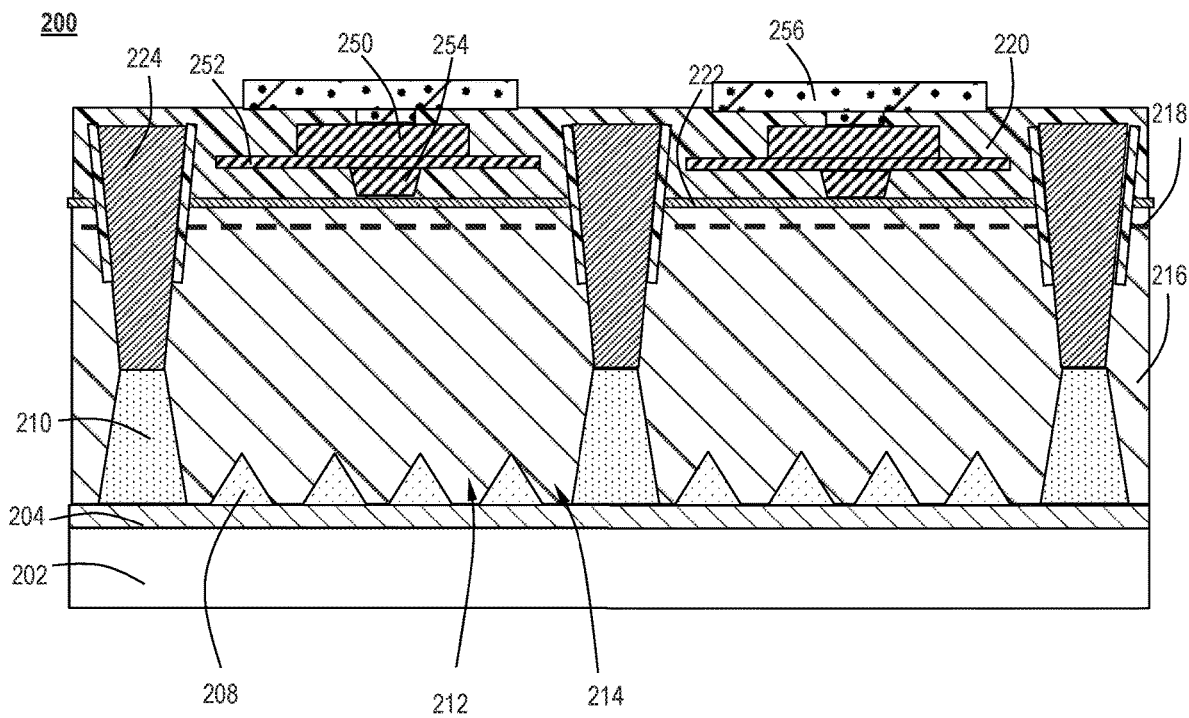
FIG. 2F illustrates a cross-sectional view of a light emitting diode (LED) device according to one or more embodiments.

Referring to FIG. 2F, in one or more embodiments, a transparent conductive layer 222 (e.g., indium tin oxide (ITO)) is grown on the III-nitride layer 216 and the active region 218 before the p-type layer 220. An eVia 250 forms a contact with the transparent conductive layer 222. The eVia contact 250 is on a metal reflector 252. The metal reflector 252 is on a metal layer 254 covering the dielectric via opening. Under bump metallization 256 contacts the metal layer 254. The semiconductor layers may then be etched to form a plurality of mesas. In one or more embodiments, a metallic cathode layer 224, or an n-type contact, is deposited in the trench. In one or more embodiments, the cathode layer 224 may comprise any suitable material known to the skilled artisan. In one or more embodiments, the cathode layer 224 comprises an n-contact material selected from one or more of silver (Ag) and aluminum (Al).

In one or more embodiments, the cathode layer 224 aligns with the second plurality of features 210. In one or more embodiments, alignment marks are defined in the same step as the second plurality of features 210. These marks are used to align the layers of the device 200 with the second plurality of features 210. Alignment is made through the semiconductor layers 216, though, alternatively, a portion of the semiconductor layers 216 may be etched away above the alignment marks to obtain better mark fidelity. Alignment for these etch windows can be to the wafer notch or flat.

Figure 2G:
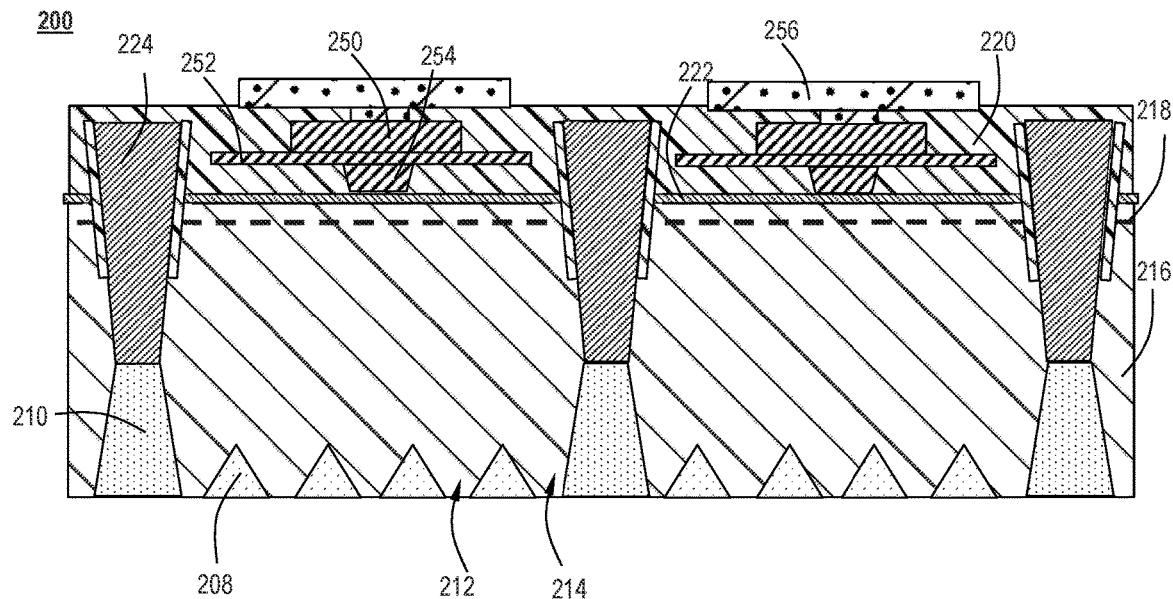
FIG. 2G illustrates a cross-sectional view of a light emitting diode (LED) device according to one or more embodiments.

FIG. 2G is a cross-section view of a LED device 200 according to one or more embodiments. FIG. 2G illustrates a device with the substrate 202 and nucleation layer 204 removed after laser lift-off. In one or more embodiments, the first plurality of features 208 and the second plurality of features 210 remain attached to the III-nitride layer 216.

In one or more embodiments, the Architecture relies on a proper recipe for laser lift-off to aim at the nucleation layer 204 interface and guarantee the integrity of the first plurality of features 208 and the second plurality of features 210. This may require a different laser power and wavelength. It is important that the nucleation layer 204 beneath the first plurality of features 208 and the second plurality of features 210 is thick enough so that all of the laser lift-off light is absorbed within the nucleation layer 204. Otherwise, any laser lift-off light that passes through the nucleation layer 204 will also pass through the first plurality of features 208 and the second plurality of features 210 and will be absorbed within the III-nitride layer 216 for the first plurality of features 208 causing separation at this interface or will be absorbed by the metal trench material 224 for the second plurality of features 210 causing high extraction efficiency and high package efficiency.

Since the nucleation layer 204 thickness required to absorb all laser lift-off light may be much thicker than the optimal nucleation layer 204 thickness for subsequent III-nitride layer 216 growth between the pattern features, some embodiments, as show in FIG. 1 at operation 108, may include etching the nucleation layer in the areas between the pattern features. This approach allows for both optimal nucleation layer 204 thickness for subsequent epi growth between the pattern features and sufficient nucleation layer thickness for laser lift-off under the pattern features. The areas between the pattern features will also separate from the sapphire without issue since the laser lift-off light will also be absorbed in the III-nitride layer 216 in these regions.

Figure 2H:
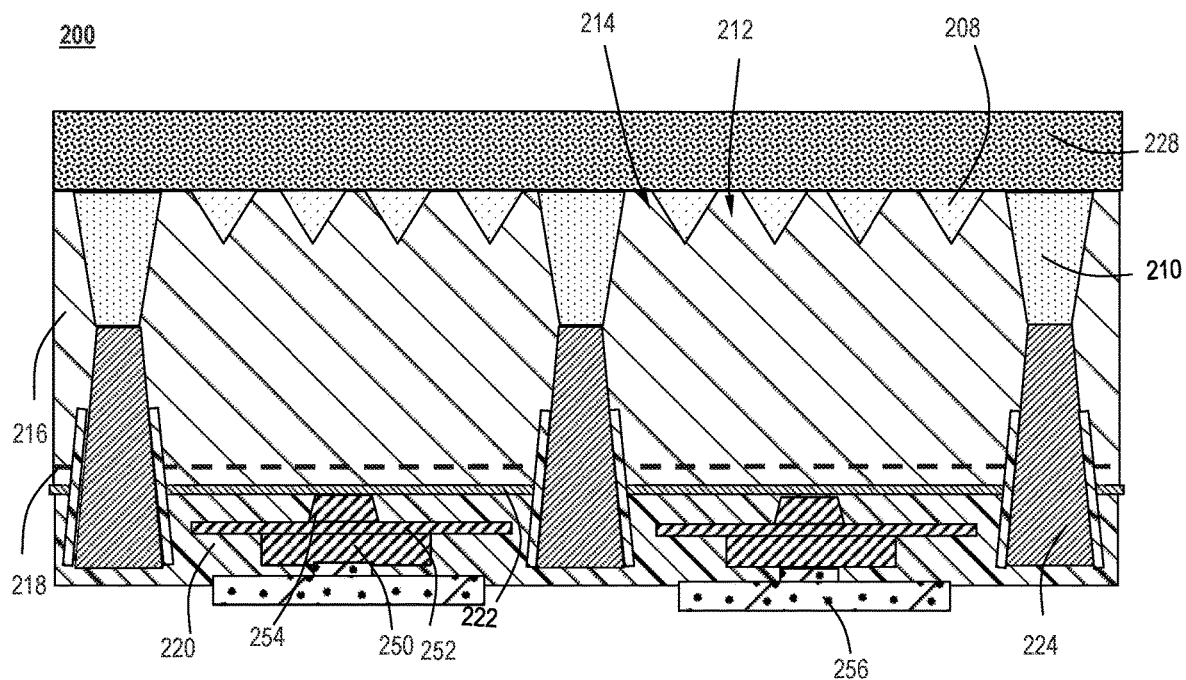
FIG. 2H illustrates a cross-sectional view of a light emitting diode (LED) device according to one or more embodiments.

FIG. 2H is a cross-section view of a LED device 200 according to one or more embodiments. Referring to FIG. 2H, a phosphor layer 228 is deposited. Crosstalk may exist through the second plurality of features 210 and the metallic cathode layer 224. In one or more embodiments, both extraction efficiency and package efficiency increase significantly.

Figure 2I:
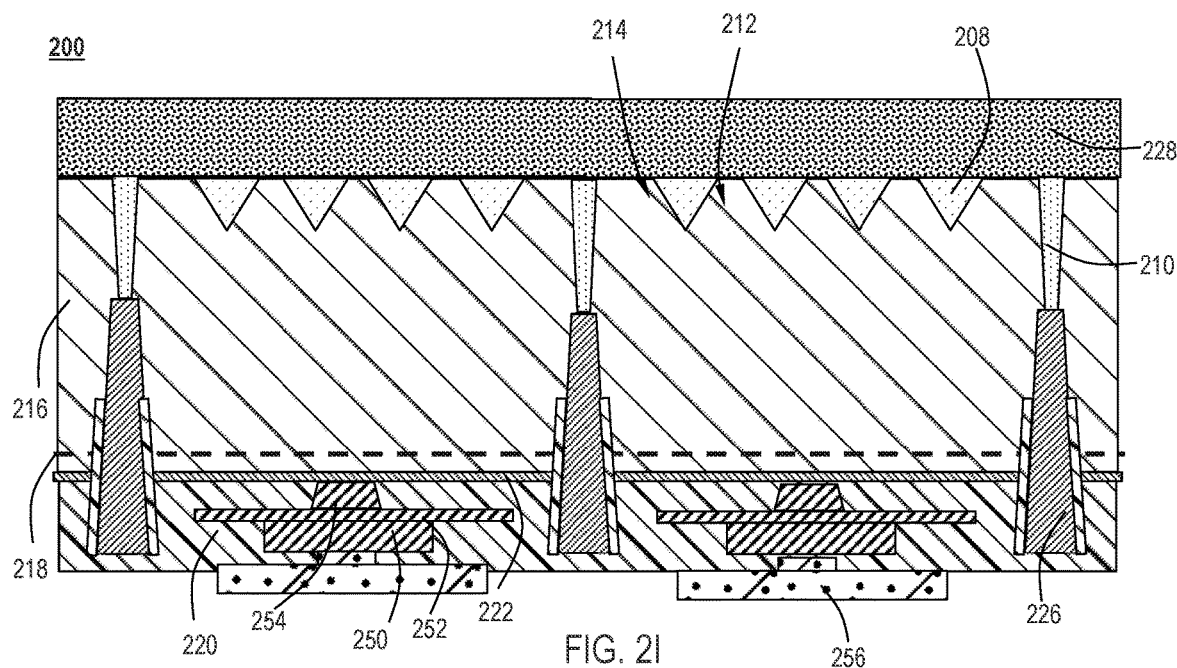
FIG. 2I illustrates a cross-sectional view of a light emitting diode (LED) device according to one or more alternative embodiments.

FIG. 2I is a cross-section view of a LED device 200 according to one or more alternative embodiments. With reference to FIG. 2I, in one or more embodiments, the second plurality of features 210 have a width that is less than the width of the first plurality of features 208. In one or more embodiments, the second plurality of features 210 have a width that is less than the width of the metallic cathode layer 224.

In one or more embodiments, the second plurality of features 210 has a width in a range of from about 100 nm to about 10 µm, including a range from about 100 nm to about 5 µm, and a range of from about 500 nm to about 10 µm. In one or more embodiments, the first plurality of features 208 has a width in a range of from about 5 nm to about 3 µm, including a range from about 10 nm to about 2 µm, and a range of from about 100 nm to about 1 µm. Crosstalk may exist through the second plurality of features 210. In one or more embodiments, both extraction efficiency and package efficiency increase significantly.

Figure 2J:
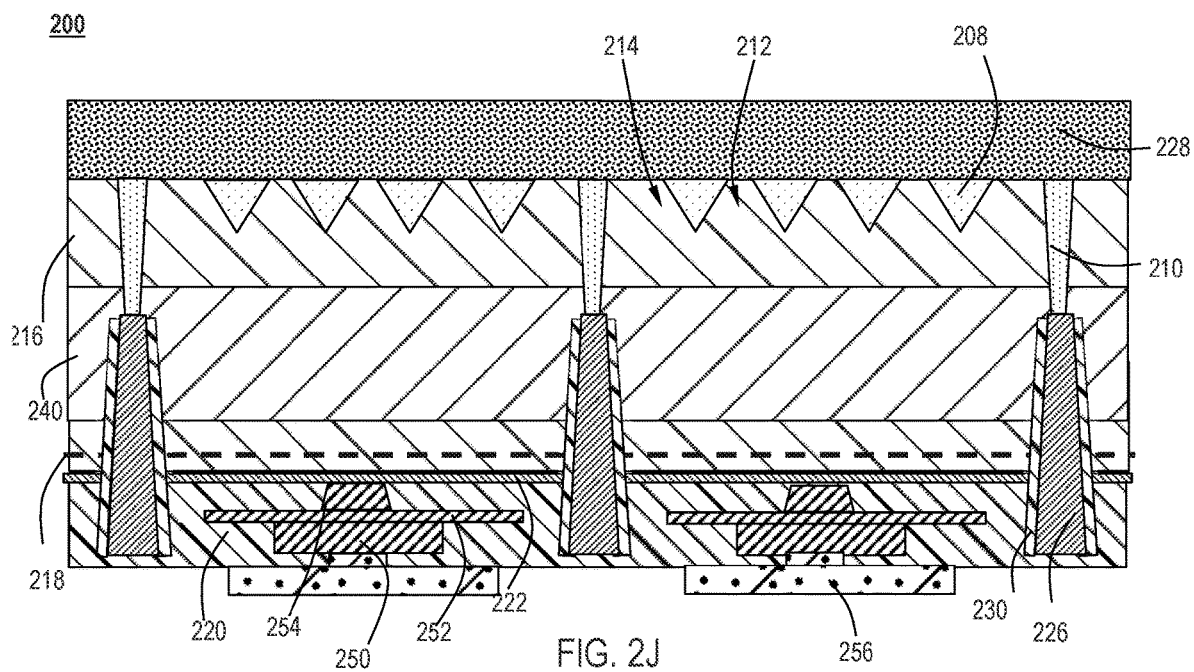
FIG. 2J illustrates a cross-sectional view of a light emitting diode (LED) device according to one or more alternative embodiments.

FIG. 2J is a cross-section view of a LED device 200 according to one or more alternative embodiments. With reference to FIG. 2J, in one or more embodiments, the structure 200 has a partial metal trench 226. In one or more embodiment, cross-talk exists through the second plurality of features 210 and the converter layer 228. In one or more embodiments, both extraction efficiency and package efficiency increase significantly. In one or more embodiments, the bottom of the metal trench 226 may be wider than the second plurality of features 210, so that metal-semiconductor contact in the n++ region 240 of the semiconductor is possible. If the latter is possible, then the spacer layer 230 may be extended down to the bottom of the metal trench 226 to mitigate optical losses.

Figure 2K:
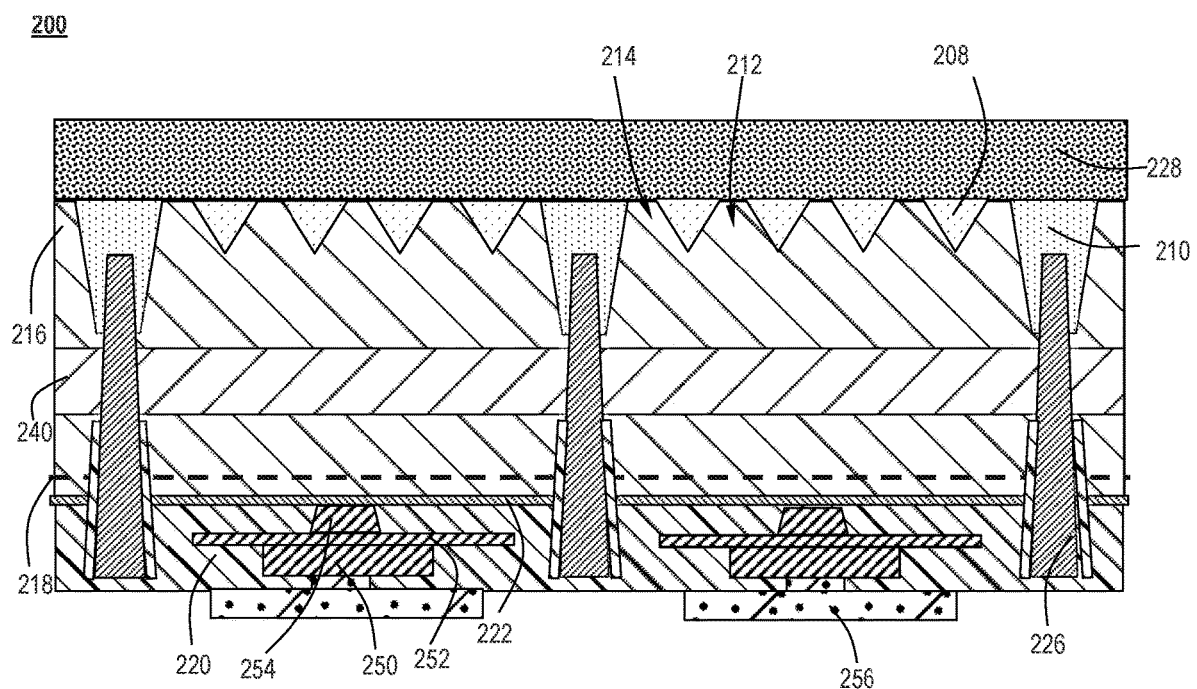
FIG. 2K illustrates a cross-sectional view of a light emitting diode (LED) device according to one or more alternative embodiments.

FIG. 2K is a cross-section view of a LED device 200 according to one or more alternative embodiments. With reference to FIG. 2K, in one or more embodiments, the structure 200 has a metal trench 226 extending into the second plurality of features 210. In one or more embodiments, cross-talk existing through the second plurality of features 210 is reduced by extending the metal trench 226 into the features 210.

Figure 3:
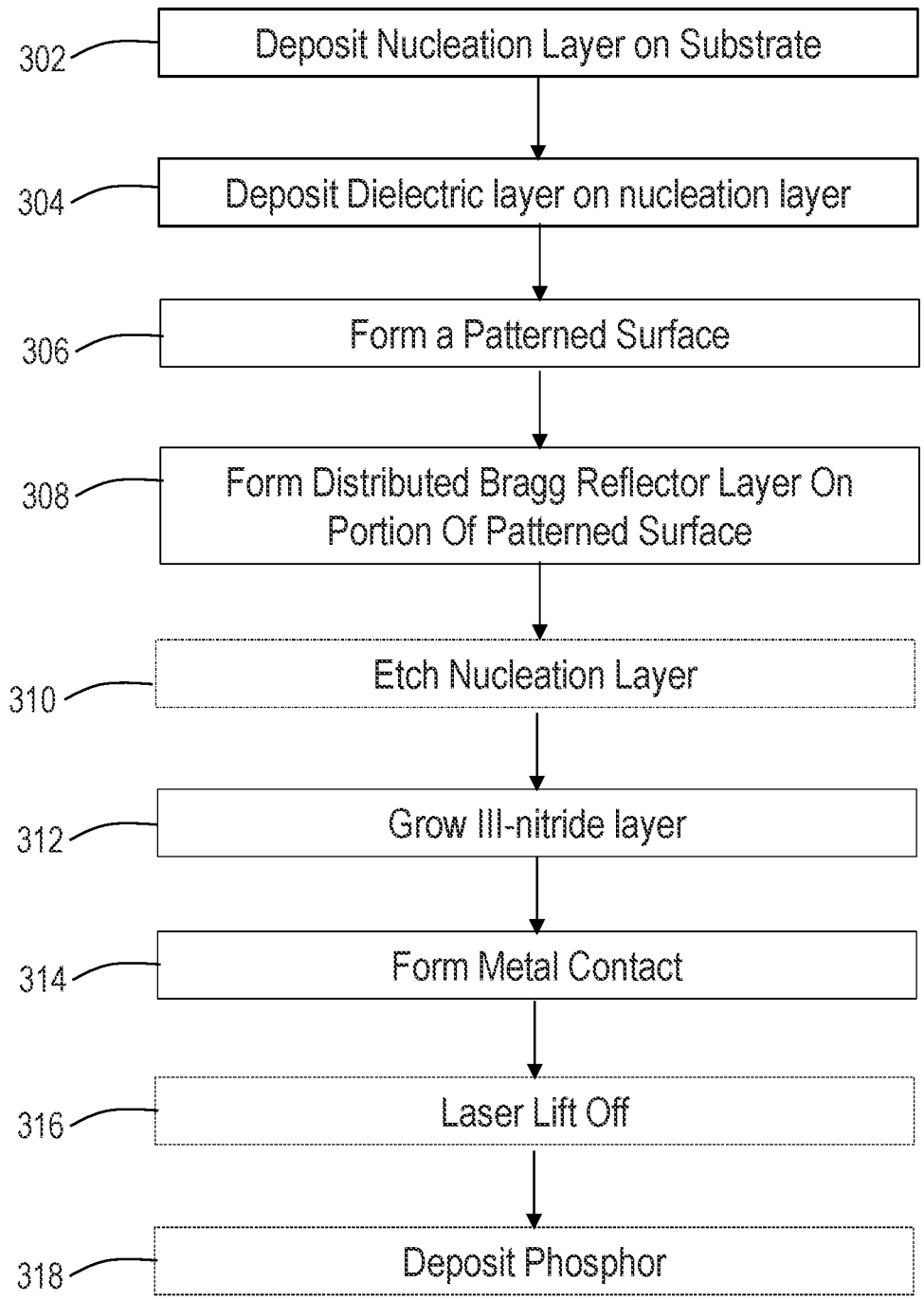
FIG. 3 illustrates a process flow diagram for a method according to one or more embodiments.

FIG. 3 depicts a flow diagram of a method 300 of manufacturing a light emitting diode (LED) device in accordance with one or more embodiments of the present disclosure. With reference to FIG. 3, in one or more embodiments, the method begins at operation 302 by depositing a nucleation layer on a substrate. At operation 304 a dielectric layer is deposited on the nucleation layer. At operation 306, a patterned surface is formed. At operation 308, a distributed Bragg reflector (DBR) is formed on a portion of the patterned surface. At operation 312, a III-nitride layer is grown, e.g., epitaxially, on the areas of the nucleation layer which are not covered by dielectric material. At operation 314, a metal contact is formed. At operation 316, the substrate (e.g., sapphire) is removed by laser lift-off. At operation 318, a phosphor layer may be deposited.

Figure 4A:
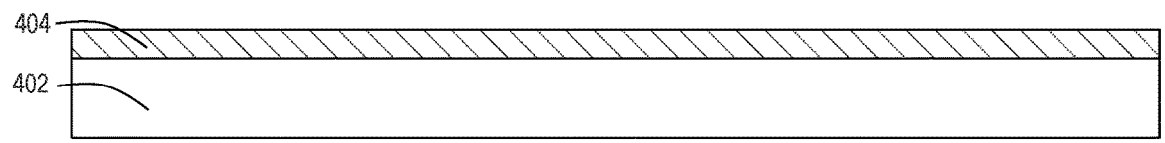
FIG. 4A illustrates a cross-sectional view of a light emitting diode (LED) device according to one or more embodiments.

FIG. 4A is cross-section view of a LED device according to one or more embodiments. With reference to FIG. 4A, a nucleation layer 404 is deposited on a substrate 402.

The substrate may be any substrate known to one of skill in the art. In one or more embodiments, the substrate 402 comprises one or more of sapphire, silicon carbide, silicon (Si), quartz, magnesium oxide (MgO), zinc oxide (ZnO), spinel, and the like. In one or more embodiments, the substrate is not patterned prior to deposition of the nucleation layer. Thus, in some embodiments, the substrate is not patterned and can be considered to be flat or substantially flat or planar. Accordingly, in one or more embodiments, the method of the disclosure differs significantly from the conventional patterned substrate, e.g., patterned sapphire substrate (PSS), fabrication approach in which pattern features are etched directly into the substrate before deposition of a nucleation layer.

Without intending to be bound by theory, it is thought that the deposition of a nucleation layer 404 on the substrate 402 prior to patterning provides critical advantages. In one or more embodiments, it was found that the deposition of a nucleation layer 404 on the substrate 402 prior to patterning provided performance improvements for directional emitters with the growth substrate remaining attached in the finished device. In one or more embodiments, the performance improvements include increased light extraction efficiency (ExE) in emitters without a lens (dome), increased brightness, and increased angular directionality (forward gain, effective increased lumen output within a narrow angular emission cone (e.g., 45 degrees).

In one or more embodiments, the nucleation layer 404 comprises a III-nitride material. In some embodiments, the III-nitride material comprises one or more of gallium (Ga), aluminum (Al), and indium (In). Thus, in some embodiments, the nucleation layer 404 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the nucleation layer 404 comprises aluminum nitride (AlN).

In one or more embodiments, the nucleation layer 404 has a thickness in a range of from about 5 nm to about 100 nm, including a range of from about 10 nm to 75 nm, a range of from about 5 nm to about 90 nm, a range of from about 10 nm to about 60 nm, a range of from about 5 nm to about 50 nm, a range of from about 10 nm to about 50 nm, and a range of from about 10 nm to about 90 nm.

In one or more embodiments, the nucleation layer 404 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

Figure 4B:
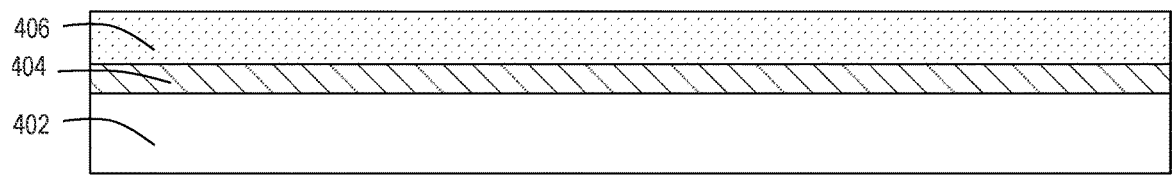
FIG. 4B illustrates a cross-sectional view of a light emitting diode (LED) device according to one or more embodiments.

FIG. 4B is cross-section view of a LED device according to one or more embodiments. With reference to FIG. 4B, a dielectric layer 406 is deposited on the nucleation layer 404.

The dielectric material may comprise any suitable material known to the skilled artisan. In one or more embodiments, the dielectric material 406 comprises a low refractive index material. In some embodiments, the dielectric material comprises a material have a refractive index in a range of from about 1.2 to about 1. In one or more embodiments, the dielectric layer 406 includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer 406 comprises silicon nitride ($Si_3N_4$). In one or more embodiments, the dielectric layer 406 comprises silicon oxide ($SiO_2$). In some embodiments, the dielectric layer 406 composition is non-stoichiometric relative to the ideal molecular formula. For example, in some embodiments, the dielectric layer 406 includes, but is not limited to, oxides (e.g., silicon oxide, aluminum oxide), nitrides (e.g., silicon nitride (SiN)), oxycarbides (e.g., silicon oxycarbide (SiOC)), and oxynitrocarbides (e.g., silicon oxycarbonitride (SiNCO)).

In one or more embodiments, the dielectric layer 406 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the dielectric layer 406 has a thickness in a range of from about 10 nm to about 5 μm, including from about 100 nm to about 4 μm, from about 50 nm to about 4 μm, from about 200 nm to about 3 μm.

Figure 4C:
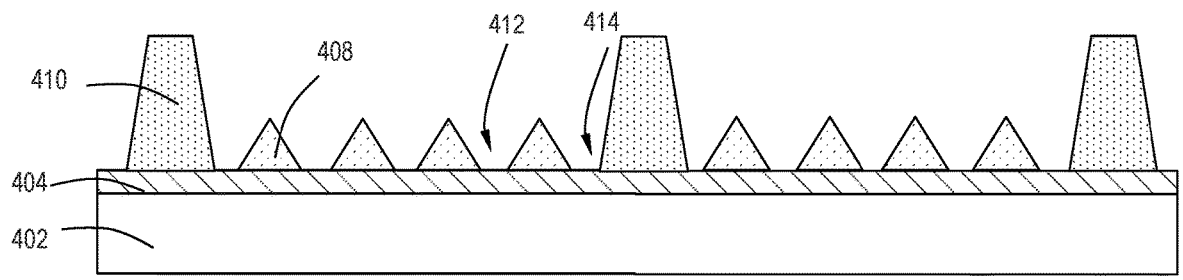
FIG. 4C illustrates a cross-sectional view of a light emitting diode (LED) device according to one or more embodiments.

FIG. 4C is a cross-section view of a LED device according to one or more embodiments. With reference to FIG. 4C, a patterned surface is formed. Thus, in one or more embodiments, a patterned dielectric layer is formed. In one or more embodiments, the dielectric layer 406 is patterned according to any appropriate patterning technique known to one of skill in the art. In some embodiments, the patterned dielectric layer comprises a first plurality of features 408 and a second plurality of features 410 adjacent to the first plurality of features 408. In one or more embodiments, the first plurality of features 408 and the second plurality of features 410 protrude from the top surface of the nucleation layer 404 and have a plurality of spaces 412, 414 between the first plurality of features 408 and the second plurality of features 410.

In one or more embodiments, a first plurality of spaces 412 is between the first plurality of features 408 and an adjacent feature 408. In one or more embodiments, a second plurality of spaces 414 is between the first plurality of features 408 and the adjacent second plurality of features 410. In one or more embodiments, the plurality of spaces 412, 414 expose a top surface of the nucleation layer 404.

In one or more embodiments, the second plurality of features 410 have a height greater than the height of the first plurality of features 408.

In one or more embodiments, the first plurality of features 408 protruding from the surface of the nucleation layer 404 can have any shape known to one of skill in the art. In one or more embodiments, the second plurality of features 410 protruding from the surface of the nucleation layer 404 can have any shape known to one of skill in the art.

In one or more embodiments, the shape of the plurality of protruding features 408 and features 410 includes, but is not limited to, a hemispherical shape, a triangular pyramidal shape, a quadrangular pyramidal shape, a hexagonal pyramidal shape, a conical shape, a semi-spherical shape, or a cut-spherical shape. In one or more embodiments, the shape of the plurality of protruding features 408 and the plurality of protruding features 410 is the same. In other embodiments, the shape of the plurality of protruding features 408 and the plurality of protruding features 410 is different.

In one or more embodiments, the first plurality of features 408 protruding from the surface of the nucleation layer 404 has a height in a range of from about 10 nm to about 3 μm, including a range of from about 500 nm to about 2 μm, a range of from about 100 nm to about 1 μm, a range of from about 250 nm to about 2.5 μm, and a range of from about 100 nm to about 2 μm.

In one or more embodiments, the second plurality of features 410 have a width that is greater than the width of the first plurality of features 408. In other embodiments, the first plurality of features 408 have a width that is greater than the width of the second plurality of features 410.

In one or more embodiments, the first plurality of features 408 protruding from the surface of the nucleation layer 404 has a width in a range of from about 5 nm to about 3 μm, including a range from about 10 nm to about 2 μm, and a range of from about 100 nm to about 1 μm.

In one of more embodiments, the first plurality of features 408 protruding from the surface of the nucleation layer 404 has a pitch in a range of from about 50 nm to about 5000 nm, including a range from about 500 nm to about 2000 nm, and a range of from about 500 nm to about 1000 nm.

In one or more embodiments, the second plurality of features 410 protruding from the surface of the nucleation layer 404 has a height in a range of from about 10 nm to about 5 μm, including a range of from about 500 nm to about 4 μm, a range of from about 100 nm to about 5 μm, a range of from about 250 nm to about 4 μm, and a range of from about 100 nm to about 5 μm.

In other embodiments, the second plurality of features 410 has a height that is 10% to 90% of the height of the III-nitride layer 416.

In one or more embodiments, the second plurality of features 410 protruding from the surface of the nucleation layer 404 has a width in a range of from about 100 nm to about 10 μm, including a range from about 100 nm to about 5 μm, and a range of from about 500 nm to about 10 μm.

In one of more embodiments, the second plurality of features 410 protruding from the surface of the nucleation layer 404 has a pitch in a range of from about 5 μm to about 80 μm, including a range from about 5 μm to about 50 μm, and a range of from about 10 μm to about 50 μm.

Figure 4D:
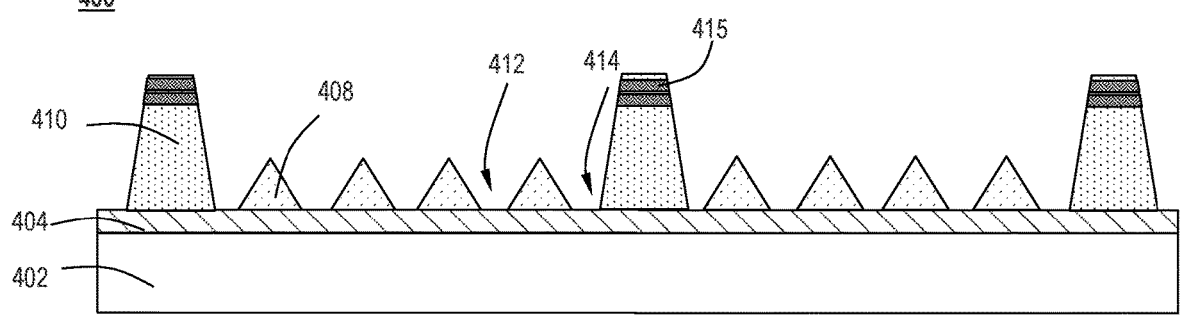
FIG. 4D illustrates a cross-sectional view of a light emitting diode (LED) device according to one or more embodiments.

FIG. 4D is a cross-section view of a LED device according to one or more embodiments. With reference to FIG. 4D, a distributed Bragg reflector 415 is formed on the second plurality of features 410 on the opposite end, or distal from, where the second plurality of features 410 contacts the nucleation layer 404. In one or more embodiments, the distribute Bragg reflector 415 are deposited on top of the second plurality of features 410 to serve as a reflector for light prior to reaching the cathode layer 424 trench material.

Distributed Bragg reflectors are typically made of multilayers of alternating thin film materials of different refractive index, wherein high reflectance is one of the key attributes. A distributed Bragg reflector or mirror is a structure formed from a multilayer stack of alternating thin film materials with varying refractive index, for example high- and low-index films. Bragg reflectors must have high reflectance. In some embodiments, the distributed Bragg reflector 415 has a thickness of at least 0.2 microns.

Figure 4E:
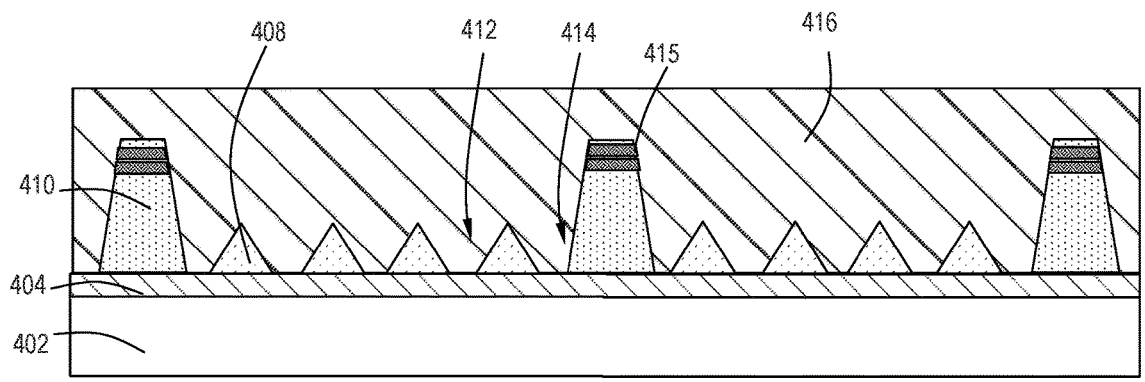
FIG. 4E illustrates a cross-sectional view of a light emitting diode (LED) device according to one or more embodiments.

FIG. 4E is a cross-section view of a LED device according to one or more embodiments. With reference to FIG. 4E, a III-nitride layer 416 is grown, e.g., epitaxially, on the patterned dielectric layer on the first plurality of features 408 and on the second plurality of features 410. In one or more embodiments, a III-nitride layer 416 is grown on the nucleation layer 404 and in or on the plurality of spaces 412, 414 between the first plurality of features 408 and the second plurality of features 410. In one or more embodiments, the first plurality of features 408 and the second plurality of features 410 have at least one sidewall (not illustrated), and the III-nitride layer grows on the at least one sidewall of the first plurality of features 408 and on the at least one sidewall of the second plurality of features 410.

In one or more embodiments, the III-nitride layer 416 comprises a III-nitride material. In some embodiments, the III-nitride material comprises one or more of gallium (Ga), aluminum (Al), and indium (In). Thus, in some embodiments, the III-nitride layer 416 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In one or more specific embodiments, the III-nitride layer 416 comprises gallium nitride. In some embodiments, the III-nitride layer 416 and the nucleation layer 404 comprise the same III-nitride material. In other embodiments, the III-nitride layer 416 and the nucleation layer 404 comprise different III-nitride materials. In a specific embodiment, the nucleation layer 404 comprises aluminum nitride (AlN) and the III-nitride layer 416 comprises gallium nitride (GaN).

In one or more embodiments, the III-nitride layer 416 is placed in a metalorganic vapor-phase epitaxy (MOVPE) reactor for epitaxy of LED device layers. Unlike during a typical MOVPE growth run, which starts with a low temperature nucleation layer, in one or more embodiments the MOVPE process starts with high temperature III-nitride growth taking advantage of the large difference in III-nitride nucleation rates on the pre-deposited nucleation layer 404 versus the surfaces of patterned dielectric layer with the first plurality of features 408 and the second plurality of features 410. In one or more embodiments, after the epitaxy, e.g., MOVPE, growth run, the device 400 is processed as is typical for a conventional PSS based LED.

Figure 4F:
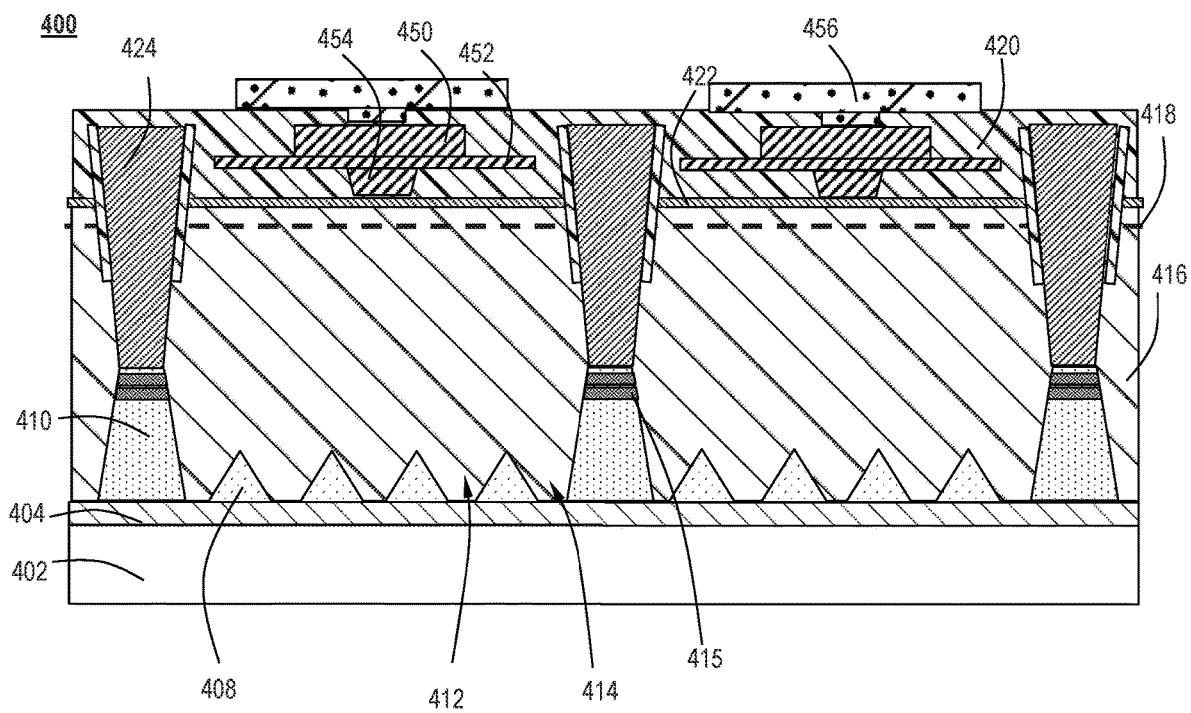
FIG. 4F illustrates a cross-sectional view of a light emitting diode (LED) device according to one or more embodiments.

Referring to FIG. 4F, in one or more embodiments, a transparent conductive layer 422 (e.g., indium tin oxide (ITO)) is grown on the III-nitride layer 416 and the active region 418 before the p-type layer 420. An eVia 450 forms a contact with the transparent conductive layer 422. The eVia contact 450 is on a metal reflector 452. The metal reflector 452 is on a metal layer 454 covering the dielectric via opening. Under bump metallization 456 contacts the metal layer 454. The semiconductor layers 416 may then be etched to form a plurality of mesas. In one or more embodiments, a metallic cathode layer 424, or an n-type contact, is deposited in the trench. In one or more embodiments, the cathode layer4 may comprise any suitable material known to the skilled artisan. In one or more embodiments, the cathode layer 424 comprises an n-contact material selected from one or more of silver (Ag) and aluminum (Al).

In one or more embodiments, the cathode layer 424 aligns with the second plurality of features 410. In one or more embodiments, alignment marks are defined in the same step as the second plurality of features 410. These marks are used to align the layers of the device 400 with the second plurality of features 410. Alignment is made through the semiconductor layers 416, though, alternatively, a portion of the semiconductor layers 416 may be etched away above the alignment marks to obtain better mark fidelity. Alignment for these etch windows can be to the wafer notch or flat.

Figure 4G:
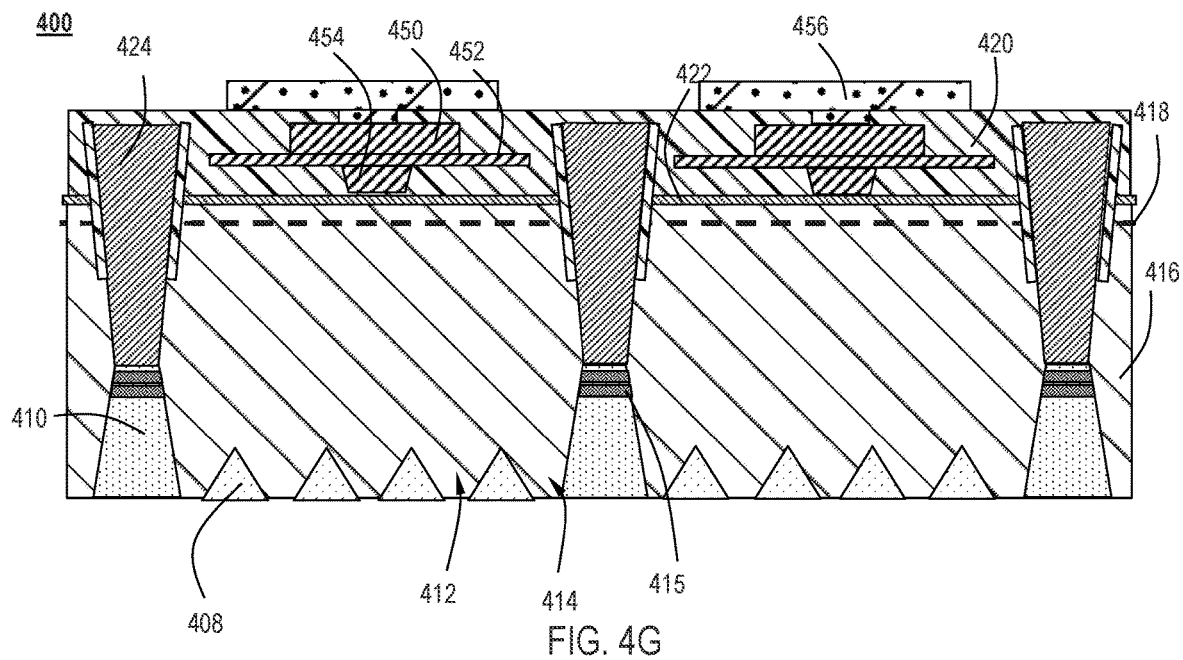
FIG. 4G illustrates a cross-sectional view of a light emitting diode (LED) device according to one or more embodiments.

FIG. 4G is a cross-section view of a LED device 400 according to one or more embodiments. FIG. 4G illustrates a device with the substrate 402 and nucleation layer 404 removed after laser lift-off. In one or more embodiments, the first plurality of features 408 and the second plurality of features 410 remain attached to the III-nitride layer 416.

In one or more embodiments, the Architecture relies on a proper recipe for laser lift-off to aim at the nucleation layer 404 interface and guarantee the integrity of the first plurality of features 408 and the second plurality of features 410. This may require a different laser power and wavelength. It is important that the nucleation layer 404 beneath the first plurality of features 408 and the second plurality of features 410 is thick enough so that all of the laser lift-off light is absorbed within the nucleation layer 404. Otherwise, any laser lift-off light that passes through the nucleation layer 404 will also pass through the first plurality of features 408 and the second plurality of features 410 and will be absorbed within the III-nitride layer 416 for the first plurality of features 408 causing separation at this interface or will be absorbed by the metal trench material 424 for the second plurality of features 410 causing high extraction efficiency and high package efficiency.

Since the nucleation layer 404 thickness required to absorb all laser lift-off light may be much thicker than the optimal nucleation layer 404 thickness for subsequent III-nitride layer 416 growth between the pattern features, some embodiments may include etching the nucleation layer in the areas between the pattern features. This approach allows for both optimal nucleation layer 404 thickness for subsequent epi growth between the pattern features and sufficient nucleation layer thickness for laser lift-off under the pattern features. The areas between the pattern features will also separate from the sapphire without issue since the laser lift-off light will also be absorbed in the III-nitride layer 416 in these regions.

Figure 4H:
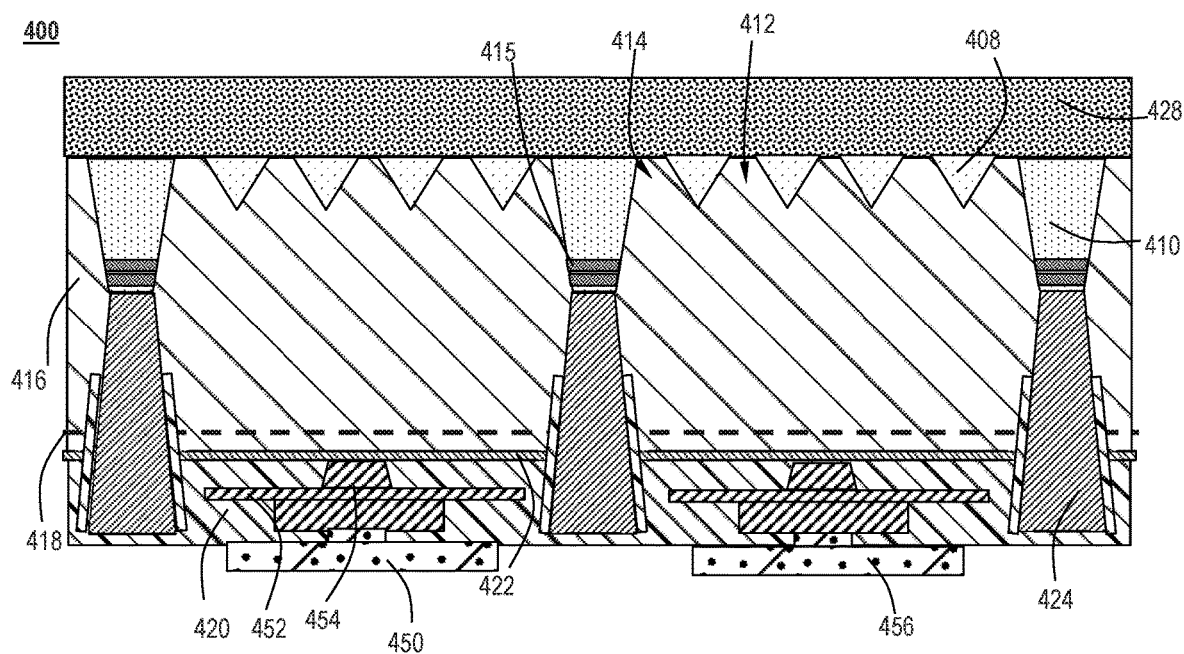
FIG. 4H illustrates a cross-sectional view of a light emitting diode (LED) device according to one or more embodiments.

FIG. 4H is a cross-section view of a LED device 400 according to one or more embodiments. Referring to FIG. 4H, a phosphor layer 428 is deposited. Crosstalk may exist through the second plurality of features 410 and the metallic cathode layer 424. In one or more embodiments, both extraction efficiency and package efficiency increase significantly.

Embodiments

Various embodiments are listed below. It will be understood that the embodiments listed below may be combined with all aspects and other embodiments in accordance with the scope of the invention.

Embodiment (a). A light emitting diode (LED) device comprising: a nucleation layer on a substrate, the nucleation layer comprising a first III-nitride material; a patterned dielectric layer on a top surface of the nucleation layer, the patterned dielectric layer comprising a first plurality of features, a second plurality of features adjacent the first plurality of features, and a plurality of spaces between the first plurality of features and the second plurality of features, the first plurality of features and the second plurality of features protruding from a top surface of the nucleation layer, the second plurality of features having a second height greater than a first height of the first plurality of features, and the plurality of spaces exposing a top surface of the nucleation layer; a III-nitride layer on the first plurality of features and on the plurality of spaces, the III-nitride layer comprising a second III-nitride material; and a metal contact aligned with and directly contacting the second plurality of features.

Embodiment (b). The light emitting diode device of embodiment (a), wherein the first plurality of features and the second plurality of features independently have a shape selected from a hemispherical shape, a triangular pyramidal shape, a quadrangular pyramidal shape, a hexagonal pyramidal shape, a conical shape, a semi-spherical shape, or a cut-spherical shape.

Embodiment (c). The light emitting diode device of embodiment (a) to (b), wherein the first height is in a range of from 10 nm to 3 μm.

Embodiment (d). The light emitting diode device of embodiment (a) to (c), wherein the second height is about 10% to 90% of a thickness of the III-nitride layer.

Embodiment (e). The light emitting diode device of embodiment (a) to (d), wherein the second plurality of features has a second width greater than a first width of the first plurality of features.

Embodiment (f). The light emitting diode device of embodiment (a) to (e), wherein the first width is in a range of from 5 nm to 3 μm and the second width is in a range of from 100 nm to 10 μm.

Embodiment (g). The light emitting diode device of embodiment (a) to (f), wherein the first plurality of features has a first width greater than a second width of the second plurality of features.

Embodiment (h). The light emitting diode device of embodiment (a) to (g), wherein the first III-nitride material and the second III-nitride material independently comprise one or more of aluminum, gallium, and indium.

Embodiment (i). The light emitting diode device of embodiment (a) to (h), wherein the first III-nitride material comprises aluminum nitride (AlN).

Embodiment (j). The light emitting diode device of embodiment (a) to (i), wherein the first III-nitride material and the second III-nitride material are the same.

Embodiment (k). The light emitting diode device of embodiment (a) to (j), wherein the dielectric layer comprises a low refractive index material having a refractive index in a range of from about 1.2 to about 2.

Embodiment (l). The light emitting diode device of embodiment (a) to (k), wherein the dielectric layer comprises one or more of silicon oxide ($SiO_2$) and silicon nitride ($Si_3N_4$).

Embodiment (m). The light emitting diode device of embodiment (a) to (l), wherein the second III-nitride material comprises gallium nitride (GaN).

Embodiment (n). The light emitting diode device of embodiment (a) to (m), wherein the nucleation layer has a thickness in a range of from about 5 nm to about 100 nm.

Embodiment (o). A method of manufacturing comprising: depositing a nucleation layer on a substrate, the nucleation layer comprising a first III-nitride material; depositing a dielectric layer on a top surface of the nucleation layer, the dielectric layer comprising a low refractive index dielectric material; patterning the dielectric layer to form a patterned surface having a first plurality of features, a second plurality of features adjacent the first plurality of features, and having a plurality of spaces between the first plurality of features and the second plurality of features, the first plurality of features and the second plurality of features protruding from a top surface of the nucleation layer, the second plurality of features having a second height and a second width greater than a first height and a first width of the first plurality of features, and the plurality of spaces exposing a top surface of the nucleation layer; epitaxially growing a III-nitride layer on the patterned surface, the III-nitride layer comprising a second III-nitride material; and forming a metal contact aligned with and directly contacting the second plurality of features.

Embodiment (p). The method of embodiment (o), wherein the first plurality of features and the second plurality of features independently have a shape selected from a hemispherical shape, a triangular pyramidal shape, a quadrangular pyramidal shape, a hexagonal pyramidal shape, a conical shape, a semi-spherical shape, or a cut-spherical shape.

Embodiment (q). The method of embodiment (o) to (p), wherein the first height is in a range of from 10 nm to 3 μm and the first width is in a range of from 5 nm to 3 μm.

Embodiment (r). The method of claim embodiment (o) to (q), wherein the second height is about 10% to 90% of a thickness of the III-nitride layer.

Embodiment (s). The method of embodiment (o) to (r), wherein the nucleation layer is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

Embodiment (t). The method of embodiment (o) to (s), wherein the dielectric layer comprises a low refractive index material having a refractive index in a range of from about 1.2 to about 2.

Embodiment (u). A light emitting diode (LED) device comprising: a nucleation layer on a substrate, the nucleation layer comprising a first III-nitride material; a patterned dielectric layer on a top surface of the nucleation layer, the patterned dielectric layer comprising a first plurality of features, a second plurality of features adjacent the first plurality of features, and a plurality of spaces between the first plurality of features and the second plurality of features, the first plurality of features and the second plurality of features protruding from a top surface of the nucleation layer, the second plurality of features having a second height greater than a first height of the first plurality of features, and the plurality of spaces exposing a top surface of the nucleation layer; a reflector layer on a surface of the second plurality of features distal from the nucleation layer; a III-nitride layer on the first plurality of features and on the plurality of spaces, the III-nitride layer comprising a second III-nitride material; and a metal contact aligned with and directly contacting the second plurality of features.

Embodiment (v) The light emitting diode device of embodiment (u), wherein the first plurality of features and the second plurality of features independently have a shape selected from a hemispherical shape, a triangular pyramidal shape, a quadrangular pyramidal shape, a hexagonal pyramidal shape, a conical shape, a semi-spherical shape, or a cut-spherical shape.

Embodiment (w). The light emitting diode device of embodiment (u) to (v), wherein the first height is in a range of from 10 nm to 3 μm.

Embodiment (x). The light emitting diode device of embodiment (u) to (w), wherein the second height is about 10% to 90% of a thickness of the III-nitride layer.

Embodiment (y). The light emitting diode device of embodiment (u) to (x), wherein the second plurality of features has a second width greater than a first width of the first plurality of features.

Embodiment (z). The light emitting diode device of embodiment (u) to (y), wherein the first width is in a range of from 5 nm to 3 μm and the second width is in a range of from 100 nm to 5 μm.

Embodiment (aa). The light emitting diode device of embodiment (u) to (z), wherein the first plurality of features has a first width greater than a second width of the second plurality of features.

Embodiment (bb). The light emitting diode device of embodiment (u) to (aa), wherein the reflector layer comprises a distributed Bragg reflector (DBR).

Embodiment (cc). The light emitting diode device of embodiment (u) to (bb), wherein the first III-nitride material and the second III-nitride material independently comprise one or more of aluminum, gallium, and indium.

Embodiment (dd). The light emitting diode device of embodiment (u) to (cc), wherein the first III-nitride material and the second III-nitride material are the same.

Embodiment (ee). The light emitting diode device of embodiment (u) to (dd), wherein the dielectric layer comprises a low refractive index material having a refractive index in a range of from about 1.2 to about 2.

Embodiment (ff). The light emitting diode device of embodiment (u) to (ee), wherein the dielectric layer comprises one or more of silicon oxide ($SiO_2$) and silicon nitride ($Si_3N_4$).

Embodiment (gg). The light emitting diode device of embodiment (u) to (ff), wherein the second III-nitride material comprises gallium nitride (GaN).

Embodiment (hh). The light emitting diode device of embodiment (u) to (gg), wherein the nucleation layer has a thickness in a range of from about 5 nm to about 100 nm.

Embodiment (ii). A method of manufacturing, comprising: depositing a nucleation layer on a substrate, the nucleation layer comprising a first III-nitride material; depositing a dielectric layer on a top surface of the nucleation layer, the dielectric layer comprising a low refractive index dielectric material; patterning the dielectric layer to form a patterned surface having a first plurality of features, a second plurality of features adjacent the first plurality of features, and having a plurality of spaces between the first plurality of features and the second plurality of features, the first plurality of features and the second plurality of features protruding from a top surface of the nucleation layer, the second plurality of features having a second height and a second width greater than a first height and a first width of the first plurality of features, and the plurality of spaces exposing a top surface of the nucleation layer; depositing a reflector layer on a surface of the second plurality of features distal from the nucleation layer; epitaxially growing a III-nitride layer on the patterned surface, the III-nitride layer comprising a second III-nitride material; and forming a metal contact aligned with and directly contacting the second plurality of features.

Embodiment (jj). The method of embodiment (ii), wherein the first plurality of features and the second plurality of features independently have a shape selected from a hemispherical shape, a triangular pyramidal shape, a quadrangular pyramidal shape, a hexagonal pyramidal shape, a conical shape, a semi-spherical shape, or a cut-spherical shape.

Embodiment (kk). The method of embodiment (ii) to (jj), wherein the first height is in a range of from 10 nm to 3 µm and the first width is in a range of from 5 nm to 3 µm.

Embodiment (ll). The method of embodiment (ii) to (kk), wherein the second height is about 10% to 90% of a thickness of the III-nitride layer.

Embodiment (mm). The method of embodiment (ii) to (ll), wherein the nucleation layer is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

Embodiment (nn). The method of embodiment (ii) to (mm), wherein the dielectric layer comprises a low refractive index material having a refractive index in a range of from about 1.2 to about 2.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) device comprising:
   a nucleation layer on a substrate, the nucleation layer comprising a first III-nitride material;
   a patterned dielectric layer on a top surface of the nucleation layer, the patterned dielectric layer comprising a first plurality of features, a second plurality of features adjacent the first plurality of features, and a plurality of spaces between the first plurality of features and the second plurality of features, the first plurality of features and the second plurality of features protruding from a top surface of the nucleation layer, the second plurality of features having a second height greater than a first height of the first plurality of features, and the plurality of spaces exposing a top surface of the nucleation layer;
   a III-nitride layer on the first plurality of features and on the plurality of spaces, the III-nitride layer comprising a second III-nitride material; and
   a metal contact aligned with and directly contacting the second plurality of features.

2. The light emitting diode device of claim 1, wherein the first plurality of features and the second plurality of features independently have a shape selected from a hemispherical shape, a triangular pyramidal shape, a quadrangular pyramidal shape, a hexagonal pyramidal shape, a conical shape, a semi-spherical shape, or a cut-spherical shape.

3. The light emitting diode device of claim 1, wherein the first height is in a range of from 10 nm to 3 µm.

4. The light emitting diode device of claim 1, wherein the second height is about 10% to 90% of a thickness of the III-nitride layer.

5. The light emitting diode device of claim 1, wherein the second plurality of features has a second width greater than a first width of the first plurality of features.

6. The light emitting diode device of claim 5, wherein the first width is in a range of from 5 nm to 3 µm and the second width is in a range of from 100 nm to 10 µm.

7. The light emitting diode device of claim 1, wherein the first plurality of features has a first width greater than a second width of the second plurality of features.

8. The light emitting diode device of claim 1, wherein the first III-nitride material and the second III-nitride material independently comprise one or more of aluminum, gallium, and indium.

9. The light emitting diode device of claim 8, wherein the first III-nitride material comprises aluminum nitride (AlN).

10. The light emitting diode device of claim 8, wherein the first III-nitride material and the second III-nitride material are the same.

11. The light emitting diode device of claim 1, wherein the dielectric layer comprises a low refractive index material having a refractive index in a range of from about 1.2 to about 2.

12. The light emitting diode device of claim 11, wherein the dielectric layer comprises one or more of silicon oxide ($SiO_2$) and silicon nitride ($Si_3N_4$).

13. The light emitting diode device of claim 1, wherein the second III-nitride material comprises gallium nitride (GaN).

14. The light emitting diode device of claim 1, wherein the nucleation layer has a thickness in a range of from about 5 nm to about 100 nm.

15. A method of manufacturing the light emitting diode (LED) device of claim 1, the method comprising:
depositing the nucleation layer on the substrate, the nucleation layer comprising the first III-nitride material;
depositing a dielectric layer on the top surface of the nucleation layer, the dielectric layer comprising a low refractive index dielectric material;
patterning the dielectric layer to form the patterned dielectric layer with a patterned surface having the first plurality of features, the second plurality of features adjacent the first plurality of features, and having the plurality of spaces between the first plurality of features and the second plurality of features, the first plurality of features and the second plurality of features protruding from the top surface of the nucleation layer, the second plurality of features having the second height and the second width greater than the first height and the first width of the first plurality of features, and the plurality of spaces exposing the top surface of the nucleation layer;
epitaxially growing the III-nitride layer on the patterned surface of the patterned dielectric layer, the III-nitride layer comprising the second III-nitride material; and
forming the metal contact aligned with and directly contacting the second plurality of features.

16. The method of claim 15, wherein the first plurality of features and the second plurality of features independently have a shape selected from a hemispherical shape, a triangular pyramidal shape, a quadrangular pyramidal shape, a hexagonal pyramidal shape, a conical shape, a semi-spherical shape, or a cut-spherical shape.

17. The method of claim 15, wherein the first height is in a range of from 10 nm to 3 µm and the first width is in a range of from 5 nm to 3 µm.

18. The method of claim 15, wherein the second height is about 10% to 90% of a thickness of the III-nitride layer.

19. The method of claim 15, wherein the nucleation layer is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

20. The method of claim 15, wherein the dielectric layer comprises a low refractive index material having a refractive index in a range of from about 1.2 to about 2.

* * * * *